United States Patent [19]

Kannan et al.

[11] Patent Number: 5,053,998
[45] Date of Patent: Oct. 1, 1991

[54] SEMICONDUCTOR MEMORY DEVICE WITH DUAL DRIVERS TO SENSE AMP ARRAY

[75] Inventors: Yasushi Kannan, Otokuni; Takashi Taniguchi, Moriguchi; Michiharu Shikata, Kusatsu; Tatsumi Sumi, Mishima, all of Japan

[73] Assignee: Matsushita Electric Industrial Co., Ltd., Osaka, Japan

[21] Appl. No.: 493,686

[22] Filed: Mar. 15, 1990

[30] Foreign Application Priority Data

Mar. 15, 1989 [JP] Japan ................................ 1-67079

[51] Int. Cl.$^5$ .............................................. G11C 7/00
[52] U.S. Cl. .................................. 365/194; 365/154; 365/205; 365/208; 365/287; 365/233
[58] Field of Search ............... 365/227, 205, 207, 208, 365/233, 194, 154

[56] References Cited

U.S. PATENT DOCUMENTS

4,916,671  4/1990  Ichiguchi .......................... 365/207

Primary Examiner—Joseph E. Clawson, Jr.
Attorney, Agent, or Firm—Wenderoth, Lind & Ponack

[57] ABSTRACT

A sense amplifier is driven by two sense amplifier drivers which operate at a different timing from each other. This can prevent the increase of the peak value of an instantaneous current in the operation of the plurality of differential amplifiers, thus resulting in ensuring that the potential of the signal line connected to the sense amplifier will be changed in a rapid manner. This may bring about a solution of the problem of the delay in timing of starting of specific differential amplifiers so as to enable correct data to be transmitted to the next circuit at all times. Furthermore, by connecting the sense amplifier drivers to opposite ends of the restore and drive signal lines, respectively, the wiring resistance of the restore and drive signal lines may be substantially reduced, thereby improving precise high speed data transmission.

9 Claims, 9 Drawing Sheets

FIG. 9 PRIOR ART

SEMICONDUCTOR MEMORY DEVICE WITH DUAL DRIVERS TO SENSE AMP ARRAY

BACKGROUND OF THE INVENTION

The present invention relates to a semiconductor memory device in which a capacity element is used as a memory cell.

Recently, the integration of a semiconductor memory device has increased, and accordingly, the semiconductor memory device, which results in subsequent chip size of the semiconductor memory device has increased. Such an increase in chip size may cause longer wiring lengths, and the wiring resistance may greatly affect the semiconductor memory device in high-speed and stable operations.

Figure 6:
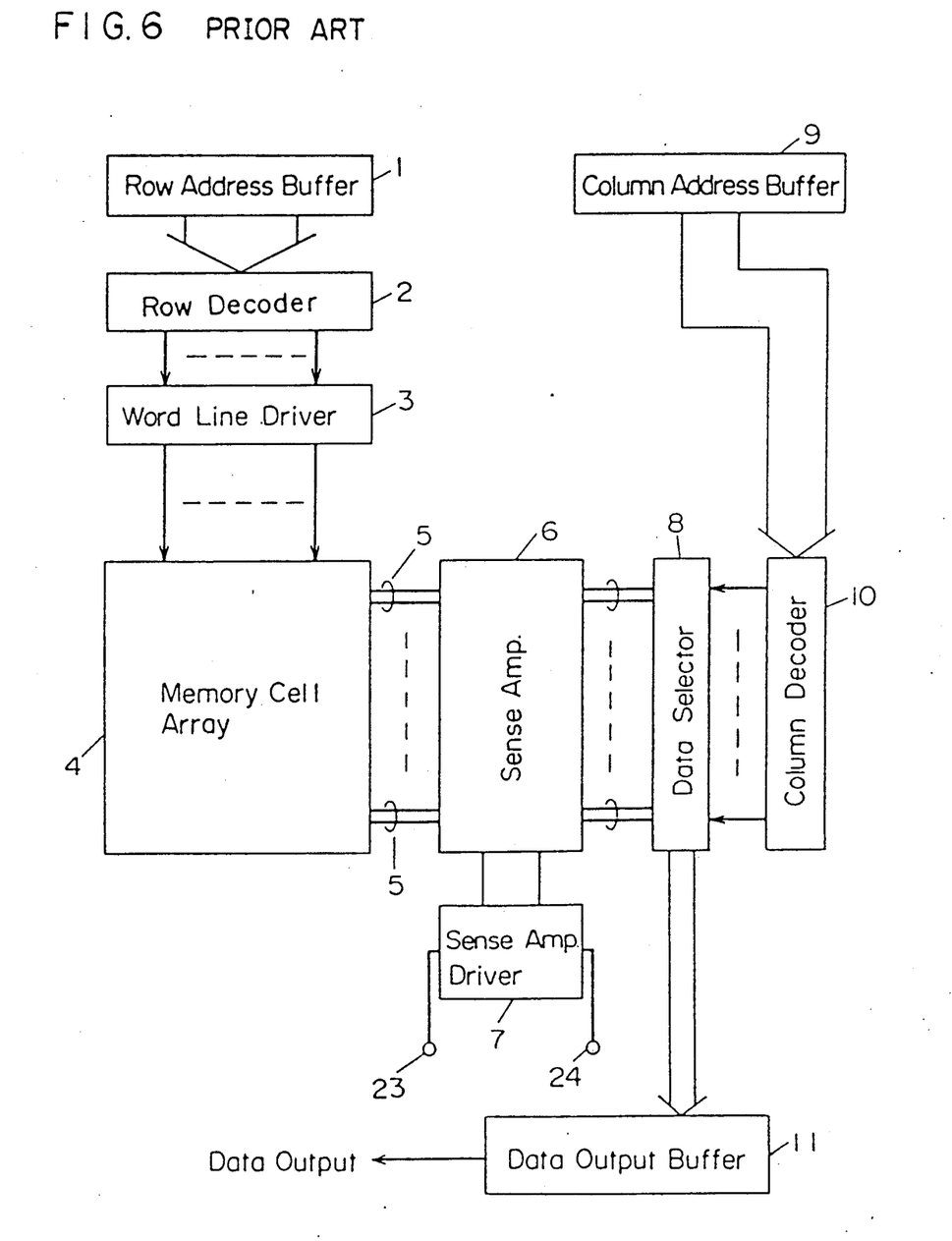
FIG. 6 is a block diagram of a substantial part of a conventional semiconductor memory device.

FIG. 6 is a block diagram showing a substantial part of a conventional semiconductor memory device.

Referring to FIG. 6, a description of the data read-out operation follows. A row address signal latched by a row address buffer 1 is decoded by a row decoder 2. A specific word line in a memory cell array 4 in which a number of memory cells are arranged in the shape of a matrix is activated by the output signal of a word line driver 3.

As a result, data from a plurality of memory cells connected to the activated word line is read out via a plurality of data lines 5 into a sense amplifier 6. The read-out data is amplified by the sense amplifier 6 which is driven by a sense amplifier driver 7, and then fed to a data selector 8. On the other hand, column address signals latched by a column address buffer 9 are decoded by a column decoder 10. The data fed to the data selector 8 is transmitted to a data output buffer 11 in response to the output of a column decoder 10, and output data is delivered from the data output buffer 11.

Figure 7:
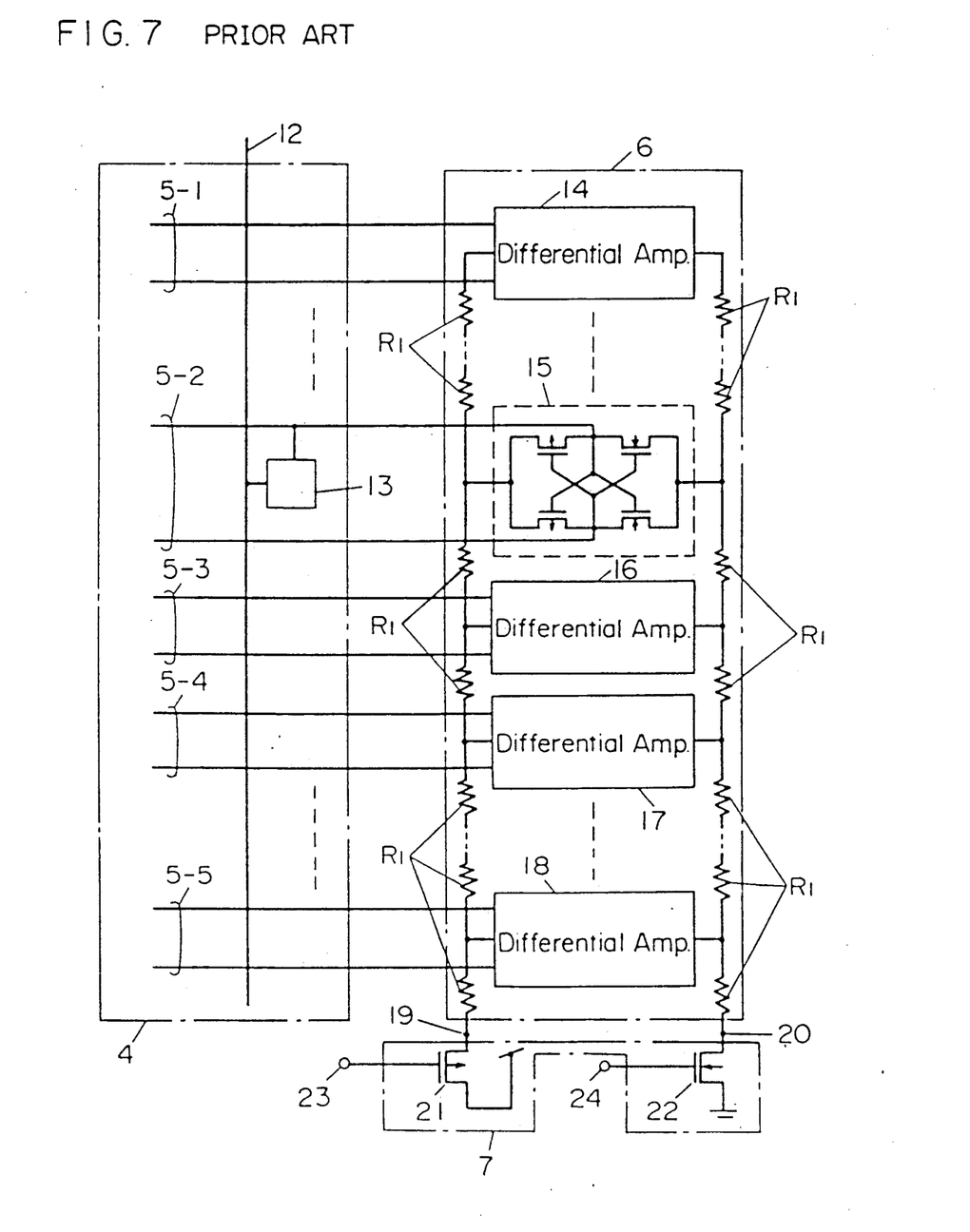
FIG. 7 is a schematic circuit diagram of the sense amplifier and its peripheral circuits of FIG. 6.

FIG. 7 is a schematic circuit diagram of part of the memory array 4, the sense amplifier 6 and the sense amplifier driver 7. As shown in FIG. 7, the data lines 5-1-5-5 are constituted by a pair of signal lines respectively, and memory cells 13 consisting of capacity elements are connected between one signal line of the respective data lines 5-1-5-5 and word line 12 (FIG. 7 shows only one memory cell 13). The sense amplifier 6 is comprised of a plurality of differential amplifiers 14-18 each connected to the data lines 5-1-5-5. The differential amplifiers 14-18 each have a pair of control terminals, one of which is connected to a restore signal line 19 and another to a drive signal line 20. R1 designates the resistance of the restore signal line 19 and drive signal line 20. The restore signal line 19 has one end connected to a p-type field effect transistor 21 and the drive signal line 20 has one end connected to an n-type field effect transistor 22. The sense amplifier driver 7 is constituted by these transistors 21 and 22. A drive signal which actuates the sense amplifier 6 is applied to the input terminals 23 and 24 of the sense amplifier driver 7. The differential amplifiers 14-18 are constituted, as specified by the differential amplifier 15, by a pair of n-type field effect transistors and a pair of p-type field effect transistors.

Figure 8:
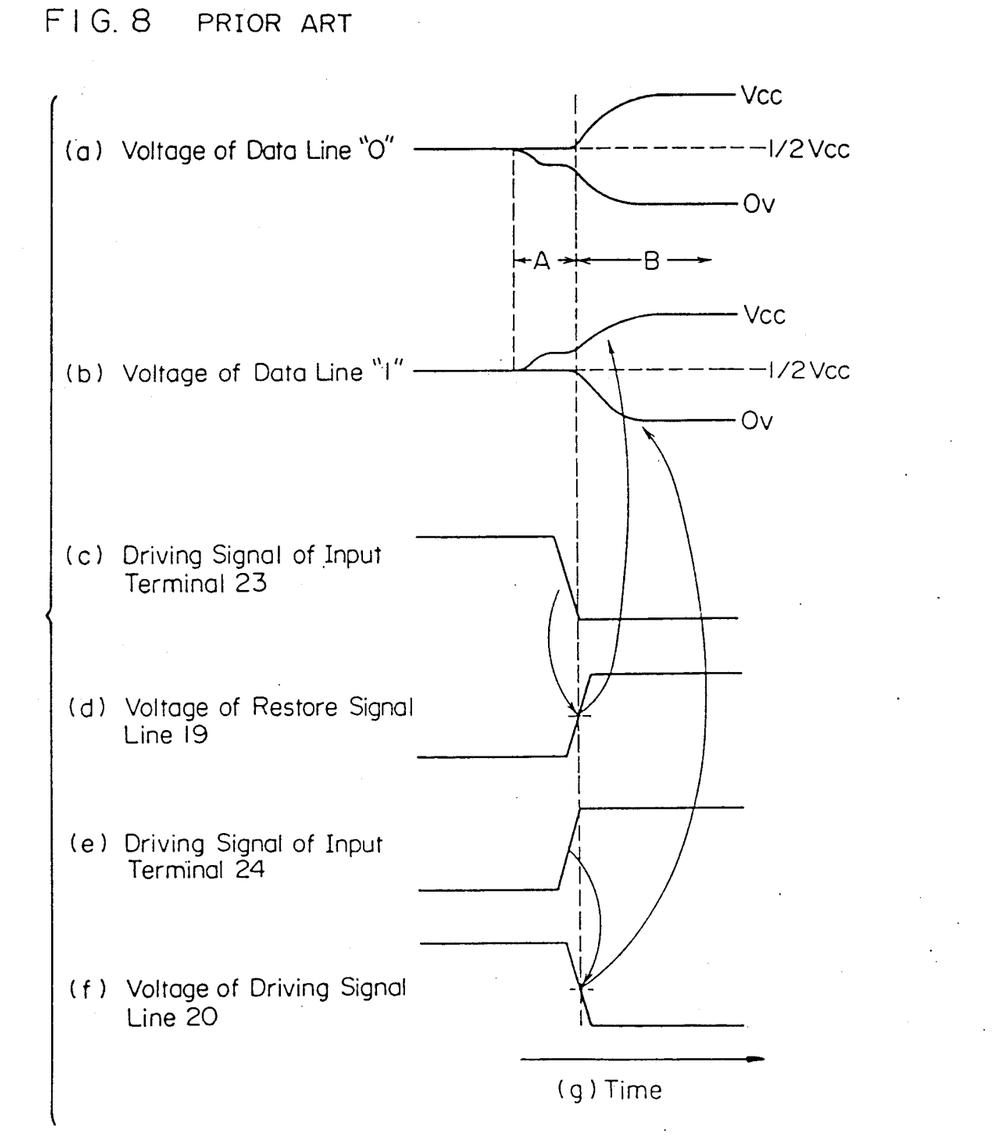
FIGS. 8 and 9 are views showing voltage waveforms used for the description of the conventional semiconductor memory device.

FIG. 8 shows voltages waveforms produced in the operation of the conventional semiconductor memory devices as shown in FIGS. 6 and 7. The abscissa axis represents time. The change of potential of the data lines 5-1-5-5 connected to the differential amplifiers 14-18 can be viewed with respect to the areas A and B in FIG. 8. The area A shows the change of potential when the data lines 5-1-5-5 are connected to the memory cells 13. In this area, the differential amplifiers 14-18 do not operate yet. The potentials of the data lines 5-1-5-5 vary with the state (0-1) of the data stored in the memory cells 13. If the data is "0", the potential of one signal line of the pair of data lines will become negative with respect to a half potential of a source voltage Vcc. If the data is "1", the potential will be positive. The area B shows the potential change after the differential amplifiers 14-18 have operated. In the area B, the voltage at the input terminal 24 of the sense amplifier driver 7 rises from the ground level, and the transistor 22 turns on. As a result, the drive signal line 20 will be grounded, so that all the differential amplifiers 14-18 will operate. Consequently, the potential of the lower voltage signal line of each pair of data lines is pulled down to the ground level. On the other hand, the voltage level at the input terminal 23 of the sense amplifier driver 7 will reach the ground level, and the transistor 21 turns on. Consequently, the potential of the higher voltage signal line of each pair of data lines is pulled up to the source voltage Vcc.

With such a conventional semiconductor memory device, however, there lies a problem in that high speed and stable operation can not be expected when the chip size becomes large due to the increase in the number of memory cells and the resultant increase in the length of the wiring.

Figure 9:
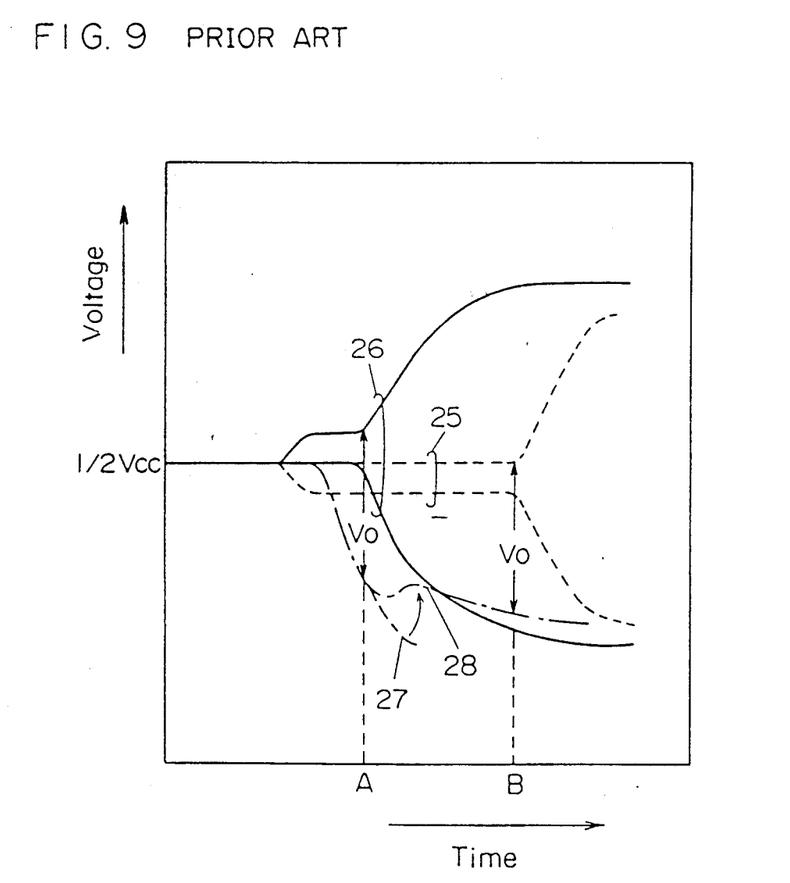

FIG. 9 shows the potential change under the condition that only one of the differential amplifiers 14-18 amplifies the data "0" and all the rest differential amplifiers amplify the data "1". In FIG. 9, 25 identifies a potential change of the data line when the data "0" is read out, and 26 is a potential change of the data line when the data "1" is read-out. Elements 27 and 28 are a potential change of the drive signal line 20; it is shown that the wiring resistance R1 has a small value at 27 and that the wiring resistance R1 has a great value at 28.

As is apparent from curves 25 and 26 in FIG. 9, before operating the differential amplifiers 14-18, the potential of the data line of data "1" rises rapidly, while the potential of the data line of data "0" rises slowly. The differential amplifiers 14-18 start their operation when the potential of drive signal line 20 drops to the value which the potential difference between the higher voltage signal line of a pair of data lines and the drive signal line 20 becomes equal to a threshold voltage Vo. In FIG. 9, the differential amplifier starts amplification of data "1" at the time A. At this time, the wiring resistance R1 of the drive signal line 20 is small, the differential amplifier instantly starts amplification of data "0". However, if the wiring resistance R1 is large, all differential amplifiers 14-18 operate simultaneously, and thus, a great deal of instantaneous electrical current flows. This causes a potential drop at the drive signal line 20, so that there will be a timing delay in the lowering of a drive signal as shown by the curve 28 despite the fact that there should be an inherent variation as shown by the curve 27. As a result, the operation start timing of the differential amplifiers for amplifying the data at state "0" moves from the point A to the point B. If such a delay increases, it becomes difficult to transmit the data correctly to a following circuit.

The pair of n-type field effect transistors perform operations dominantly in the differential amplifiers 14-18 as shown in FIG. 7. Thus, as in FIG. 9, when a single differential amplifier serves to amplify the data "0" and all the remaining differential amplifiers serve to amplify the data "1", a delay of the operation start timing will become significant.

SUMMARY OF THE INVENTION

The object of the present invention is to provide a semiconductor memory device which may overcome the conventional problems.

One object of the present invention is to provide a semiconductor memory device in which the influence of the wiring resistance can be lessened to enable high-speed operation.

Another object of this invention is to provide a semiconductor memory device which makes it possible to reduce the instantaneous current in the operation of the sense amplifier.

In accordance with the present invention, in short, a sense amplifier is driven by two sense amplifier drivers which operate at different from each other.

This can prevent the increase of the peak value of an instantaneous current in the operation of the plurality of differential amplifiers, thus resulting in ensuring that the potential of the signal line connected to the sense amplifiers will be changed in a rapid manner. This may bring about a solution of the problem of the delay in timing of starting of specific differential amplifiers so as to enable correct data to be transmitted to the next circuit at all times.

Further objects and effects of the present invention will become clear by describing the embodiments with reference to the drawings.

DETAILED DESCRIPTION OF THE INVENTION

The embodiments of the present invention will now be described with reference to the drawings.

Figure 1:
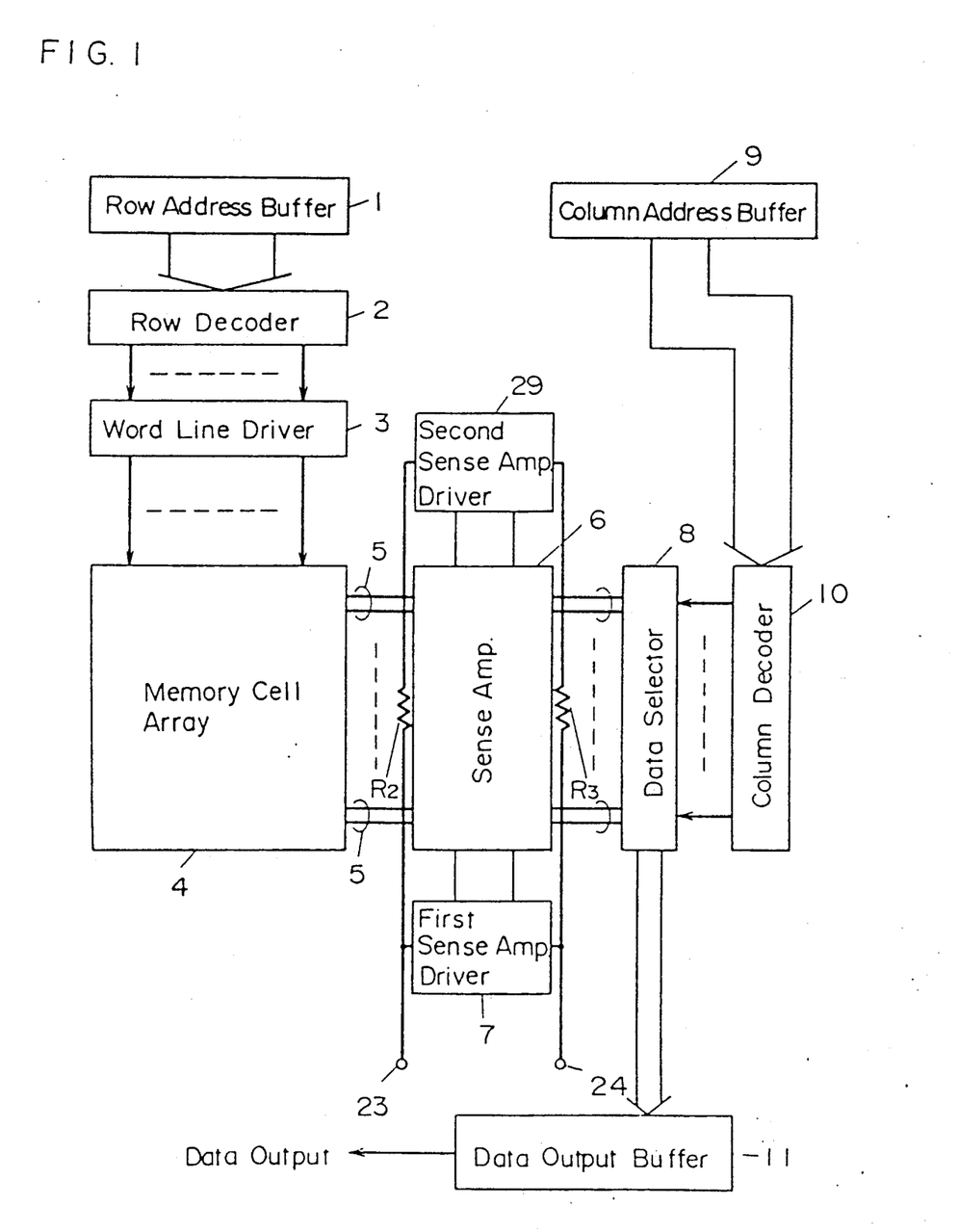
FIG. 1 is a block diagram of a substantial part of the semiconductor memory device in accordance with the present invention.

FIG. 1 is a view showing the first embodiment of the present invention. FIG. 1 is different from FIG. 6 only in that the sense amplifier 6 has one end connected to a first sense amplifier driver 7, and has its other end connected to a second amplifier driver 29.

Figure 2:
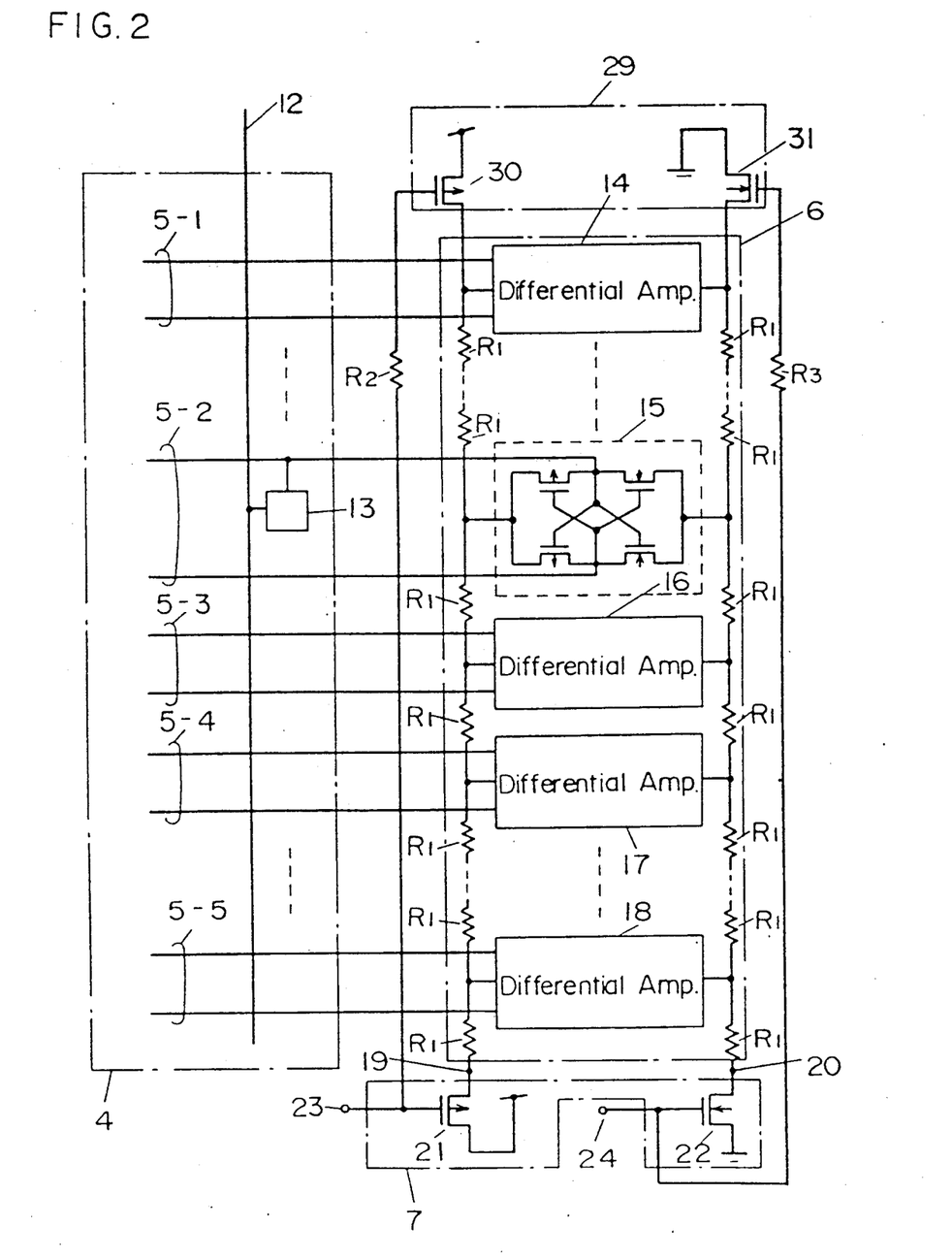
FIG. 2 is a schematic circuit diagram of the sense amplifier and its peripheral circuits of FIG. 1.

FIG. 2 is a view showing a particular circuitry arrangement containing the sense amplifier 6 and its peripheral circuits in FIG. 1. In FIG. 2, the same reference numbers are applied to the same elements as those of the prior art as shown in FIG. 7. A p-type field effect transistor 30 and an n-type field effect transistor 31 are connected to the other end of the sense amplifier 6, i.e. the other end of a restore signal line 19 and the other end of a drive signal line 20 respectively, said transistors 30 and 31 constituting a second sense amplifier driver 29. The gates of the transistors 30 and 31 are connected to the input terminals 23 and 24 of the first sense amplifier driver 7 respectively. R2 and R3 designate wiring resistances of the signal lines adapted to actuate the transistors 30 and 31.

A description of the embodiment as shown in FIGS. 1 and 2 follows.

First, when data from a memory cell 13 is sensed by data lines 5-1-5-5, there will arise slight potential differences between the signal lines of each pair of data lines 5-1-5-5. Then, drive signals are applied to the input terminals 23 and 24 of the first sense amplifier driver 7 so as to make the transistors 21 and 22 of the sense amplifier driver 7 conduct. Consequently, electric current flows in the restore signal line 19 and the drive signal line 20, and thus, the differential amplifiers 14-18 start to operate. The operation as described above is same as in the prior art.

In the embodiment of FIGS. 1 and 2, however, at the start of the differential amplifiers 14-18 connected in common to the restore signal line 19 and drive signal line 20, the second sense amplifier driver 29 starts its operation before a great amount of instantaneous current flows. In other words, prior to the drop of a voltage caused by the instantaneous current through the wiring resistance R1, the transistors 30 and 31 consisting the second amplifier driver 29 conduct late by a time constant determined by the wiring resistances R2 and R3 of the signal lines connected to the second sense amplifier 29 and the parasitic capacitances of these signal lines. As a result, it is possible to to reduce the value of the wiring resistance R1 of the restore signal line 19 and drive signal line 20 to something around the half of the value of the prior art. As shown in FIG. 9, in the period from the rise of the drive signal to the start of operation of the differential amplifiers 14-18, a period of time is required wherein the differential amplification signal falls by a threshold voltage Vo below the potential of the data line. Consequently, it is unnecessary for the transistors 30 and 31 constituting the second sense amplifier driver 29 to conduct concurrently with the transistors 21 and 22 constituting the first sense amplifier driver 7. Thus, by taking advantage of the time constant determined by the wiring resistances R2 and R3 and the parasitic capacitance, the actuation of the second sense amplifier driver 29 is delayed so as to be later than the first sense amplifier driver 7, to ensure that the peak value of the instantaneous current at the time of start of operation of the differential amplifiers 14-18 will be reduced. As a result, the potential of the drive signal line 20 presents a change close to that shown by a curve 27 of FIG. 9, dropping at a rapid speed. In this connection, the differential amplifiers for amplifying the data "0" can start at the time near the point A rather than removing its starting time to the point B as in the case of the prior art. The precise transmission of data to the next circuit can be secured accordingly.

Figure 3:
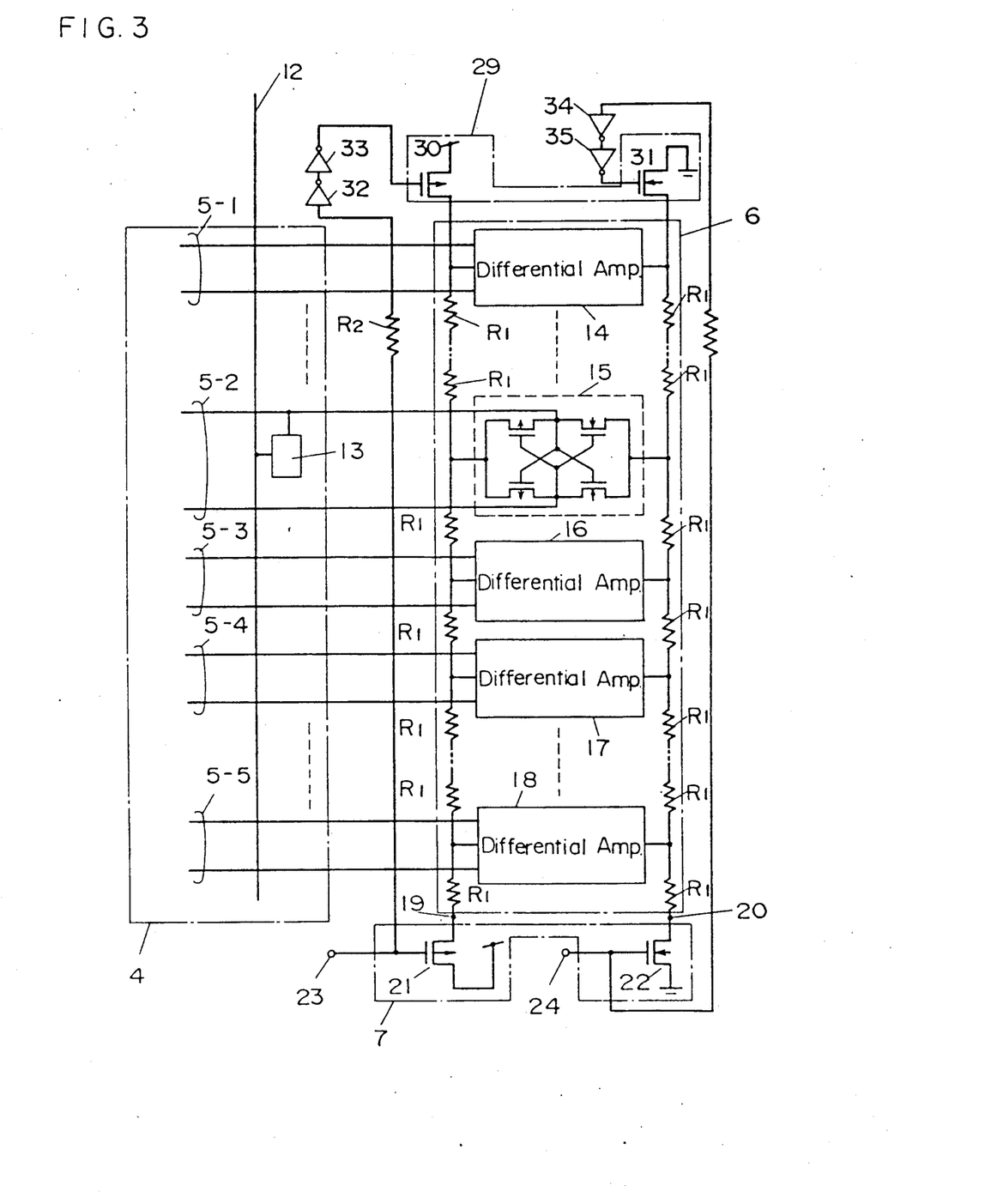
FIG. 3 is a schematic circuit diagram of the sense amplifier and its peripheral circuits of the semiconductor memory device of a second embodiment according to the present invention.

FIG. 3 is a view showing a circuit of the sense amplifier and its peripheral circuits in the semiconductor memory device of the second embodiment in accordance with the present invention.

In the drawing, the same reference numbers are applied to the same elements as those shown in FIG. 2. FIG. 3 is a different from FIG. 2 in that two pairs of inverter circuits 32 and 33 and 34 and 35 are connected to two signal lines for supplying a drive signal to the second sense amplifier driver 29. Such an addition of the necessary numbers of inverter circuits 32-35 makes it possible to determine the optimum amount of delay time. As a result, a semiconductor memory device can be made which is capable of, in the most effective manner, restraining the peak value of an instantaneous current at the time of starting of the operation of the differential amplifiers 14-18.

Figure 4:
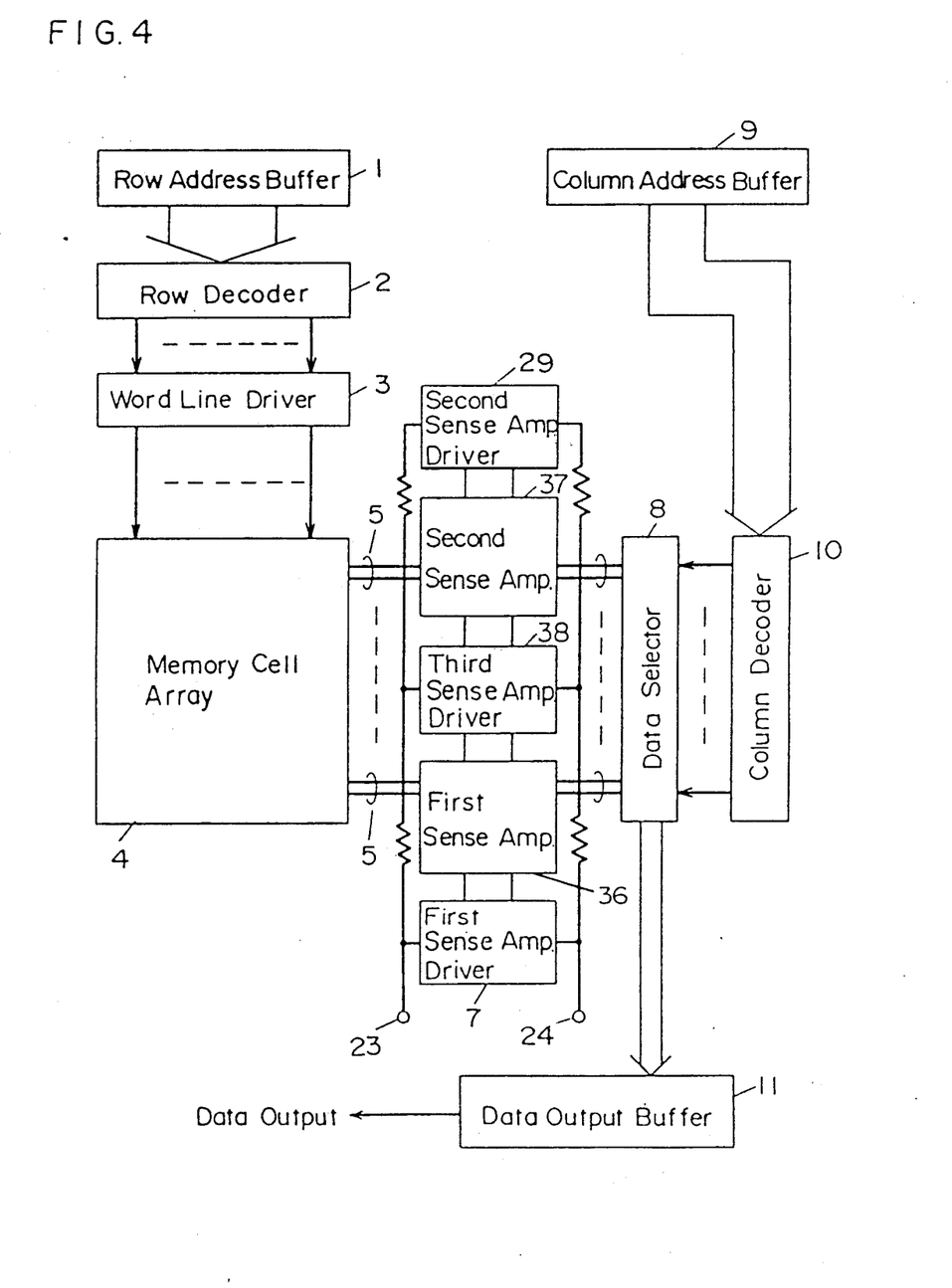
FIG. 4 is a block diagram showing a substantial part of the semiconductor memory device of a third embodiment of the present invention.

FIG. 4 is a view showing a third embodiment of the present invention. The application of the same reference numbers to the same circuit blocks as those of FIG. 1 avoids the necessity of further descriptions thereof. FIG. 4 differs from FIG. 1 in that there are provided two blocks, i.e. first and second sense amplifiers 36 and 37 which correspond to the sense amplifier 6 in FIG. 1, with a third sense amplifier 38 disposed between said first and second sense amplifiers 36 and 37 to connect it to the latter.

Figure 5:
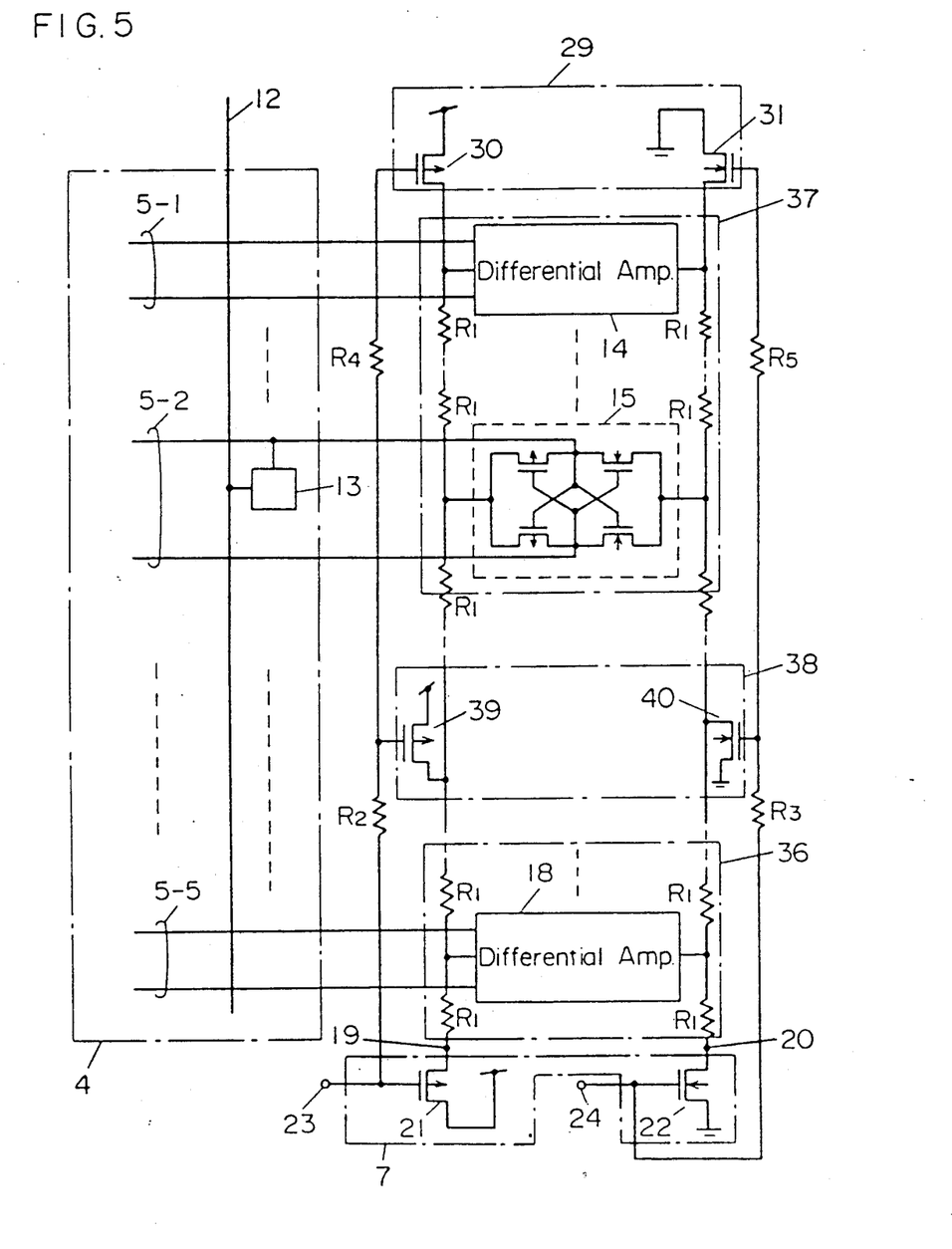
FIG. 5 is a schematic circuit diagram of the sense amplifiers and its peripheral circuits of FIG. 4.

FIG. 5 is a view showing the particular circuits as a substantial portion of FIG. 4. The same reference numbers are applied to the same elements as those in FIGS. 2 and 3, and a further description thereof has been omitted. In FIG. 5, the third sense amplifier driver 38 consisting of a p-type field effect transistor 39 and an n-type field effect transistor 40 is disposed between and connected to the first and second sense amplifiers 36 and 37, R4 and R5 identify wiring resistances of the signal lines extending between the second and third sense amplifier drivers 29 and 38. Such an arrangement ensures that the opposite ends of the first sense amplifier 36 will be driven by means of the first and second sense amplifier drivers 7 and 38 and that the second sense amplifier 37 will be driven by means of the third and second sense amplifier drivers 38 and 29. In this instance, with the first sense amplifier 36, the third sense amplifier driver 38 tends to start later than the first sense amplifier driver 7 by a time constant when the time constant is determined by the wiring resistances R2 and R3 and the parasitic capacitance. And in the second sense amplifier 37, the second sense amplifier driver 29 starts to operate later than the third sense amplifier driver 38 by a time constant determined by the wiring resistances R4 and R5 and the parasitic capacitance. Therefore, reduction of the peak value of the instantaneous current at the time of operation of the differential amplifiers 14-18 can possibly by achieved in either sense amplifiers 36 and 37.

Also, provision can, of course, be made for a necessary number of inverter circuits as shown in FIG. 3 which are connected to the drive signal lines of the first, second and third sense amplifier drivers 7, 29, 38 to obtain the optimum amount of delay time.

Furthermore, a sense amplifier may be divided into more than 3 blocks in such a manner that each of sense amplifier drivers will be located between and connected to the respective sense amplifier blocks.

We claim:

1. A semiconductor memory device comprising:
   a memory cell array having a plurality of memory cells arranged in the form of a matrix;
   a means for reading into a plurality of data lines data from a plurality of memory cells connected to a specific word line by activating said specific word line of said memory cell array;
   a sense amplifier consisting of a plurality of differential amplifiers connected to said plurality of data lines respectively for amplifying the data read into said plurality of data lines;
   first and second sense amplifier drivers connected to the opposite ends of a restore signal line and a drive signal line respectively which are in turn connected to said plurality of differential amplifiers of said sense amplifiers, and
   a delay means for giving a time difference to an operation start timing of said first and second sense amplifier drivers.

2. A semiconductor memory device as defined in claim 1, wherein said delay means is constituted by the wiring resistances and parasitic capacitance of the drive signal lines located between and connected to the said first and second sense amplifier drivers.

3. A semiconductor memory device as defined in claim 1, wherein said delay means is constituted by the wiring resistances and parasitic capacitance of the drive signal lines located between and connected to the said first and second sense amplifier drivers, and an inverter circuit means connected to said drive signal line.

4. A semiconductor memory device comprising:
   a memory cell array having a plurality of memory cells arranged in the form of a matrix;
   a means for reading into a plurality of data lines data from a plurality of memory cells connected to a specific word line by activating said specific word line of said memory cell array;
   a first sense amplifier consisting of a plurality of differential amplifiers connected to a specific number of data lines of said plurality of data lines respectively for amplifying data read into said specific number of data lines;
   a second sense amplifier consisting of a plurality of differential amplifiers connected to remaining data lines of said plurality of data lines respectively for amplifying data read into said remaining data lines;
   first and second sense amplifier drivers connected to the opposite ends of the restore signal line and drive signal line which are in turn connected in common to the differential amplifiers of said first and second sense amplifiers;
   a third sense amplifier driver connected to said restore signal line and said drive signal line which are disposed between said first and second sense amplifiers, and
   a delay means for giving a time difference to the starting operation timing of said first, second and third sense amplifier drivers.

5. A semiconductor memory device as defined in claim 4, wherein said delay means is constituted by the wiring resistances and parasitic capacitance of the drive signal lines located between and connected to said first, second and third sense amplifier drivers.

6. A semiconductor memory device as defined in claim 4, wherein said delay means is constituted by the wiring resistances and parasitic capacitance of the drive signal lines disposed between and connected to said first, second and third sense amplifier drivers, and an inverter means connected to said drive signal lines.

7. A semiconductor memory device comprising:
   a memory cell array having a plurality of memory cells arranged in the form of a matrix;

a means for reading into a plurality of data lines data from said plurality of memory cells in said memory cell array;

sense amplifiers consisting of a plurality of differential amplifiers for amplifying data read into said plurality of data lines;

a plurality of sense amplifier drivers connected to a plurality of positions of the signal lines respectively which are in turn connected in common to said plurality of differential amplifiers, and a means for giving a time difference to the operation starting timing of said plurality of sense amplifier drivers.

8. A semiconductor memory device as defined in claim 7, wherein said delay means is constituted by the wiring resistance and parasitic capacitance of said signal lines.

9. A semiconductor memory device as defined in claim 7, wherein said delay means is constituted by the wiring resistance and parasitic capacitance of said signal lines, and an inverter circuit means connected to said signal lines.

* * * * *